United States Patent [19]

Matsumoto

[11] Patent Number: 5,530,670
[45] Date of Patent: Jun. 25, 1996

[54] SEMICONDUCTOR MEMORY DEVICE AND CONTROL METHOD FOR THE SAME

[75] Inventor: Akihiro Matsumoto, Osaka, Japan

[73] Assignee: Matsushita Electronics Corporation, Osaka, Japan

[21] Appl. No.: 318,331

[22] Filed: Oct. 5, 1994

[30] Foreign Application Priority Data

Nov. 10, 1993 [JP] Japan ................................. 5-279993

[51] Int. Cl.$^6$ ....................................................... G11C 7/00
[52] U.S. Cl. ............................. 365/189.01; 365/189.12; 365/230.04; 365/230.05
[58] Field of Search .................... 365/189.01, 230.04, 365/230.05, 230.09, 189.12, 239

[56] References Cited

U.S. PATENT DOCUMENTS

| | | | |
|---|---|---|---|
| 5,040,149 | 8/1991 | Ibihara et al. ................ | 365/230.04 X |
| 5,319,603 | 6/1994 | Watanabe et al. ............ | 365/230.04 X |
| 5,418,745 | 5/1995 | Watanabe ..................... | 365/230.05 X |

Primary Examiner—David C. Nelms
Assistant Examiner—Huan Hoang
Attorney, Agent, or Firm—Willian Brinks Hofer Gilson & Lione

[57] ABSTRACT

In a semiconductor memory device of a multiple-output port type including a plurality of read buses, data in a write bus are sequentially written into write registers, and the thus written data are transferred to the even-numbered bit-line pairs of a memory cell array section, and then data are again written into the write registers, after which the thus written data are transferred to the odd-numbered bit-line pairs. Then, the data in the even-numbered bit-line pairs are transferred to read A registers which correspond to one of the read buses, and the thus transferred data are sequentially read into the read bus, and thereafter, the data in the odd-numbered bit-line pairs are transferred to the read A registers and the thus transferred data are sequentially read into the read bus. Thus, the total number of read registers corresponding to all the read buses is made equal to that of the bit-line pairs, and is accordingly smaller as compared with a conventional semiconductor memory device. This allows all the read registers to be aligned along the same lane, so that the entire memory chip can be made smaller in size.

8 Claims, 4 Drawing Sheets

SEMICONDUCTOR MEMORY DEVICE AND CONTROL METHOD FOR THE SAME

BACKGROUND OF THE INVENTION

The present invention relates to a semiconductor memory device and a control method for the semiconductor memory device, and more particularly, it relates to improved serial-parallel and parallel-serial converting sections of a semiconductor memory device which includes a plurality of serial-access ports.

A semiconductor memory device including a plurality of serial-access ports is known in the prior art. FIG. 4 shows an example of such a semiconductor memory device, which has one input port and two output ports. This semiconductor memory device includes one write bus, two read buses A and B, line registers in which data obtained immediately after reset are stored, a memory cell array section including "0"th to (2n+1)th bit-line pairs, write registers the number of which is equal to that of the bit-line pairs, read A registers which correspond to the read bus A and the number of which is equal to that of the bit-line pairs, and read B registers which correspond to the read bus B and the number of which is equal to that of the bit-line pairs. A write operation in which data are written to the line registers and to the bit-line pairs of the memory cell array section is as follows: While serial data is being sequentially input to the write bus in synchronization with a clock, gates for selecting the line registers are first sequentially turned on, so that the "0"th to (2n+1)th data obtained immediately after reset are respectively written to the corresponding line registers, and then gates for selecting the write registers are sequentially turned on in synchronization with the clock, thereby allowing the data to be respectively written to the corresponding write registers. Thereafter, write data-transfer gates respectively connected to the write registers are simultaneously turned on, thereby transferring the data in the write registers into the corresponding bit-line pairs of the memory cell array section. Accordingly, the data are stored in parallel in the memory cell array section. When data are to be read out into the read bus A, the following read operation is carried out: First, gates for data-transfer A to the read A registers are simultaneously turned on, thereby transferring the parallel data from the bit-line pairs of the memory cell array section to the corresponding read A registers. At the same time, gates connecting the line registers to the read bus A are sequentially turned on in synchronization with the clock, thereby allowing the data in the line registers to be sequentially read out into the read bus A. Then, gates for selecting the read A registers are sequentially turned on in synchronization with the clock, thereby allowing the data in the read A registers to be serially read out into the read bus A. The operation of reading out data into the read bus B is carried out in the same manner as in the above-described operation of reading out data into the read bus A.

The conventional semiconductor memory device described above, however, has the following defect: As described above, the bit-line pairs in the memory cell array section are respectively connected to the read A registers corresponding to the read bus A, and also respectively connected to the read B registers corresponding to the read bus B. This requires the read A registers and the read B registers to be respectively aligned along two different lanes. Specifically, either the read A registers or the read B registers are required to be aligned along a lane located outside the lane along which the other registers (i.e., either the read B registers or the read A registers) are aligned. Therefore, the conventional semiconductor memory device is disadvantageous in that the memory chip thereof is large in size. Furthermore, the line registers are also required to be aligned along a lane located outside the lanes along which the read A registers and the read B registers are aligned, thereby causing the disadvantage of making the memory chip larger in size.

It is an object of the present invention to provide reduction in the chip size of a semiconductor memory device including a plurality of read buses (i.e., including a plurality of output ports), by reducing the number of read registers of the semiconductor memory device.

SUMMARY OF THE INVENTION

In order to achieve the above-mentioned object, the present invention provides a semiconductor memory device having a structure in which each of the read buses is provided with read registers corresponding thereto, and each of these read registers is shared by more than one bit-line pair of the memory cell array section.

Specifically, a semiconductor memory device according to the present invention comprises a single write bus, k read buses, where k is an integer greater than one (1) a memory cell array section including a plurality of bit-line pairs partitioned into groups of k bit-line pairs, a plurality of write registers for receiving data from the write bus, and sets of read registers, the sets respectively corresponding to the read buses. This semiconductor memory device comprises: a first write data-transfer means for transferring data from the write registers to every first bit line pair of the bit-line pair groups of the memory cell array section; second, . . . , kth write data-transfer means for transferring data from the write registers to every (i+1)th (where i=1, 2, . . . , k−1) bit-line pair of the bit-line pair groups of the memory cell array section; a first read data-transfer means which is capable of transferring the data from every first bit-line pair of the bit-line pair groups of the memory cell array section to the sets of read registers; and second, . . . , kth read data-transfer means which are capable of transferring the data from every (i+1)th bit-line pair of the bit-line pair groups of the memory cell array section to the sets of read registers.

The present invention also provides a control method for the above-described the semiconductor memory device. In this control method, data are sequentially input from the single write bus to the write registers, and then the thus input data are transferred to every first bit-line pair of the bit-line pair groups of the memory cell array section by the first write data-transfer means, and thereafter, data are again sequentially input from the write bus to the write registers, and the thus input data are transferred to every (i+1)th bit-line pair of the bit-line pair groups of the memory cell array section sequentially by the (i+1)th write data-transfer means, the inputting and transfer of data being repeated, thereby completing the writing of the data into all the bit-line pairs of the memory cell array section. Thereafter, the data in every first bit-line pair of the bit-line pair groups of the memory cell array section are transferred by the first read data-transfer means into a single set of read registers corresponding to one of the read buses which is used for reading of data, and accordingly, the thus transferred data are sequentially read out of the read bus, and then the data in every (i+1)th bit-line pair of the bit-line pair groups of the memory cell array section are transferred into the single set of read registers sequentially by the (i+1)th read data-transfer means, and accordingly, the thus transferred data are sequentially read out of the read bus, the transfer and reading of data being repeated, thereby completing the reading of the data from all the bit-line pairs of the memory cell array section.

With the above-described structure, according to the present invention, even if the semiconductor memory device is of a multiple-output port type with a plurality of read buses which are each provided with a plurality of read registers, each of the read registers is shared by two or more adjacent bit-line pairs of the memory cell array section, so that the total number of the read registers can be made equal to or smaller than the number of the bit-line pairs of the memory cell array section. This allows all the read registers to be aligned along the same lane, thereby reducing the size of the memory chip.

The above-described object and novel features of the present invention will be fully understood upon reading the following detailed description of the invention while referring to the accompanying drawings.

BRIEF DESCRIPTION OF THE DRAWINGS

Preferred embodiments of the present invention are shown in the accompanying drawings.

DETAILED DESCRIPTION OF THE INVENTION

Preferred embodiments of the present invention will be described below with reference to the accompanying drawings.

FIRST EMBODIMENT

Figure 1:
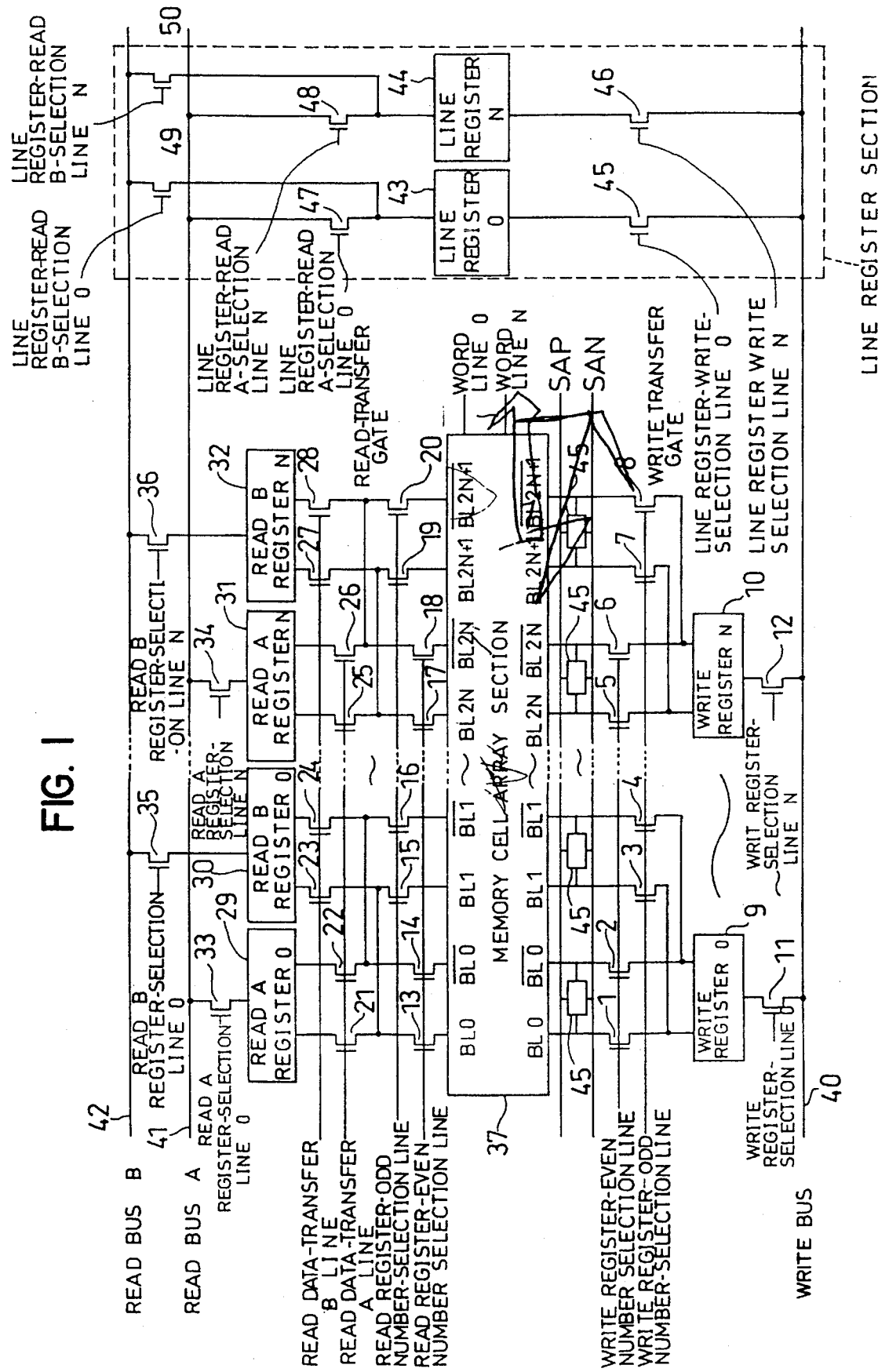
FIG. 1 is a diagram showing the structure of a semiconductor memory device according to a first embodiment of the present invention.

FIG. 1 is a diagram showing the structure of a semiconductor memory device according to a first embodiment of the present invention. The semiconductor memory device shown in FIG. 1 has one input port and two output ports A and B. Each data line in this semiconductor memory device is composed of a one-bit signal line.

In FIG. 1, the reference numeral 40 denotes a write bus, 41 a read bus A, 42 a read bus B, and 37 a memory cell array section which includes a plurality of bit-line pairs BL0,/BL0, BL1,/BL1, ..., BL2N,/BL2N, and BL2N+1,/BL2N+1. Each of the bit-line pairs BL0,/BL0 to BL2N+1,/BL2N+1 is provided with a sense amplifier 45. The reference numerals 9, ..., 10 denote N+1 write registers, and the reference numerals 29, 30, ..., 31 and 32 denote 2N+2 read registers. The N+1 alternate read registers 29, ..., 31 are read A registers corresponding to the read bus A, while the other N+1 alternate read registers 30, ..., 32 are read B registers corresponding to the read bus B.

Both of the adjacent bit-line pairs BL0,/BL0 and BL1,/BL1 of the memory cell array section 37 are connected to the write register 0 (9) through write-transfer gates 1 to 4, and are connected to the read A register 0 (29) corresponding to the read bus A through read-transfer gates 13 to 16, 21 and 22, and are also connected to the read B register 0 (30) corresponding to the read bus B through the above-mentioned read-transfer gates 13 to 16 and other read-transfer gates 23 and 24.

Similarly, both of the adjacent bit-line pairs BL2N,/BL2N and BL2N+1,/BL2N+1 are connected to the write register N (10) through write-transfer gates 5 to 8, and are connected to the read A register N (31) through read-transfer gates 17 to 20, 25 and 26, and are also connected to the read B register N (32) through the read-transfer gates 17 to 20 and other read-transfer gates 27 and 28.

The above-mentioned N+1 write registers 0 to N (9, ..., 10) are connected to the write bus 40 respectively through write register-selection gates 11, ..., 12. The read A registers 0 to N (29, ..., 31) are connected to the read bus A respectively through read A register-selection gates 33, ..., 34. The read B registers 0 to N (30, ..., 32) are connected to the read bus B respectively through read B register-selection gates 35, ..., 36. All of the selection and transfer gates 1 to 8, 11 to 28, and 33 to 36 are controlled by means of selection and transfer lines which respectively correspond thereto.

The write-transfer gates 1,2, ..., 5,6 constitute a first write data-transfer means for transferring N+1 data from the N+1 write registers 9, ..., 10 respectively to every first bit-line pair of groups of k bit-line pairs (where k is the number of read buses, in this case, two (2)), i.e., the even-numbered bit-line pairs BL0,/BL0, ..., BL2N,/BL2N, of the memory cell array section 37. The write-transfer gates 3,4, ..., 7,8 constitute a second write data-transfer means for transferring the N+1 data from the N+1 write registers 9, ..., 10 respectively to every (i+1)th (where i=1) bit-line pair of the bit-line pair groups, i.e., the odd-numbered bit-line pairs BL1,/BL1, ..., BL2N+1,/BL2N+1, of the memory cell array section 37. The read-transfer gates 13,14, ..., 17,18 constitute a first read data-transfer means which is capable of transferring data from every first bit-line pair of groups of k bit line pairs (where k is the number of read buses, in this case two (2)), i.e., the even-numbered bit-line pairs BL0,/BL0, ..., BL2N,/BL2N, of the memory cell array section 37 into both the read A registers and the read B registers. The read-transfer gates 15,16, ..., 19,20 constitute a second read data-transfer means which is capable of transferring data from every (i+1)th (where i=1) bit-line pair of the bit-line pair groups, i.e., the odd-numbered bit-line pairs BL1,/BL1, ..., BL2N+1,/BL2N+1, of the memory cell array section 37 into both the read A registers and the read B registers.

Line registers 0 to N (43, ..., 44) for holding data obtained immediately after reset are connected to the write bus 40 respectively through line register-write-selection gates 45, ..., 46, and connected to the read bus A respectively through line register-read A-selection gates 47, ... 48, and also connected to the read bus B respectively through line register-read B-selection gates 49, ..., 50.

Next, a data-write operation in the semiconductor memory device having the above-described structure will be described. Data to be written (herein referred to simply as "write data") are sequentially input to the write bus 40 in synchronization with a clock, and line register-write-selection lines 0 to N are first sequentially selected in synchronization with the clock, thereby allowing the write data to be sequentially written into the N+1 line registers 0 to N (43, ..., 44). Then, write register-selection lines 0 to N are sequentially selected in synchronization with the clock, thereby allowing the write data to be sequentially written into the N+1 write registers 0 to N (9, ..., 10) in synchronization with the clock.

Thereafter, the write-transfer gates 1,2, ..., 5,6 are first selected by means of a write register-even number-selection line, so that the above-mentioned data written into the write registers 9, ..., 10 are transferred to the even-numbered bit-line pairs BL0,/BL0, ..., BL2N,/BL2N of the memory cell array section 37. The details of this data-transfer process are as follows: First, one of word lines 0 to N of the memory cell array section 37 is selected, so that data previously stored in the memory cells are read out into the corresponding bit-line pairs BL0,/BL0 to BL2N+1,/BL2N+1. Then, sense amplifier-drive lines SAP and SAN are activated to activate the sense amplifiers 45, so that the data in the bit-line pairs BL0,/BL0 to BL2N+1,/BL2N+1 are defined. In this state, the write register-even number-selection line is selected, thereby allowing the data in the write registers 0 to N (9, ..., 10) to be written into the even-numbered bit-line pairs BL0,/BL0, ..., BL2N,/BL2N. Thereafter, the word line is deactivated, so that the data which have been written into the even-numbered bit-line pairs BL0,/BL0, ..., BL2N,/BL2N are written into the corresponding memory cells.

Then, in the same manner as described above, write data sequentially input to the write bus 40 are sequentially written to the write registers 0 to N (9, ..., 10) in synchronization with the clock, after which a write register-odd number-selection line is selected, thereby allowing the thus written data to be transferred respectively to the odd-numbered bit-line pairs BL1,/BL1, ..., BL2N+1,/BL2N+1 of the memory cell array section 37.

The following describes a data-read operation to be performed through one of the read buses, e.g., the read bus A: First, the data first written into the memory cell array section 37, i.e., the data stored in the even-numbered bit-line pairs BL0,/BL0, ..., BL2N,/BL2N, are transferred respectively to the corresponding read A registers 0 to N (29, ..., 31). This data-transfer process is carried out as follows: First, one of the word lines 0 to N is selected, so that the data stored in the memory cells are read out into the corresponding bit-line pairs BL0,/BL0 to BL2N+1,/BL2N+1. Then, the sense amplifier-drive lines SAP and SAN are activated to activate the sense amplifiers 45, so that the data in the bit-line pairs BL0,/BL0 to BL2N+1,/BL2N+1 are defined. Thereafter, a read register-even number-selection line and a read data-transfer A line are selected, thereby allowing the data in the even-numbered bit-line pairs BL0,/BL0, ..., BL2N,/BL2N to be read out respectively into the corresponding read A registers 0 to N (29, ..., 31).

At this time also, line register-read A-selection lines 0 to N are sequentially selected in synchronization with the clock, thereby allowing the data in the line registers 0 to N (43, ..., 44) to be read out into the read bus A (41).

Then, read A register-selection lines 0 to N are sequentially selected in synchronization with the clock, so that the data which have been read out into the read A registers 0 to N (29, ..., 31) are sequentially read out into the read bus A.

Thereafter, a read register-odd number-selection line and the read data-transfer A line are selected, so that the data which have been subsequently written into the memory cell array section 37, i.e., the data stored in the odd-numbered bit-line pairs BL1,/BL1, ..., BL2N+1,/BL2N+1, are transferred respectively to the corresponding read A registers 0 to N (29, ..., 31) in the same manner as described above.

Then, also in the same manner as described above, the read A register-selection lines 0 to N are sequentially selected in synchronization with the clock, so that the data which have been read out into the read A registers 0 to N (29, ..., 31) are sequentially read out into the read bus A. In this manner, the operation of reading data from all the bit-line pairs into the read bus A is completed.

The operation of reading out data into the read bus B is carried out in the same manner as in the above-described operation of reading out data into the read bus A.

In the present embodiment, each of the N+1 read A registers 29, ..., 31 is shared by two bit-line pairs in the memory cell array section 37, while each of the N+1 read B registers 30, ..., 32 is also shared by two bit-line pairs. This means that the total number of the read registers 29 to 32 is equal to that of the bit-line pairs in the memory cell array section 37, i.e., 2N+2. Therefore, even if the semiconductor memory device is of a two-output port type with two read buses, these 2N+2 read registers can be aligned along the same lane, so that the entire memory chip can be made smaller in size.

SECOND EMBODIMENT

Figure 2:
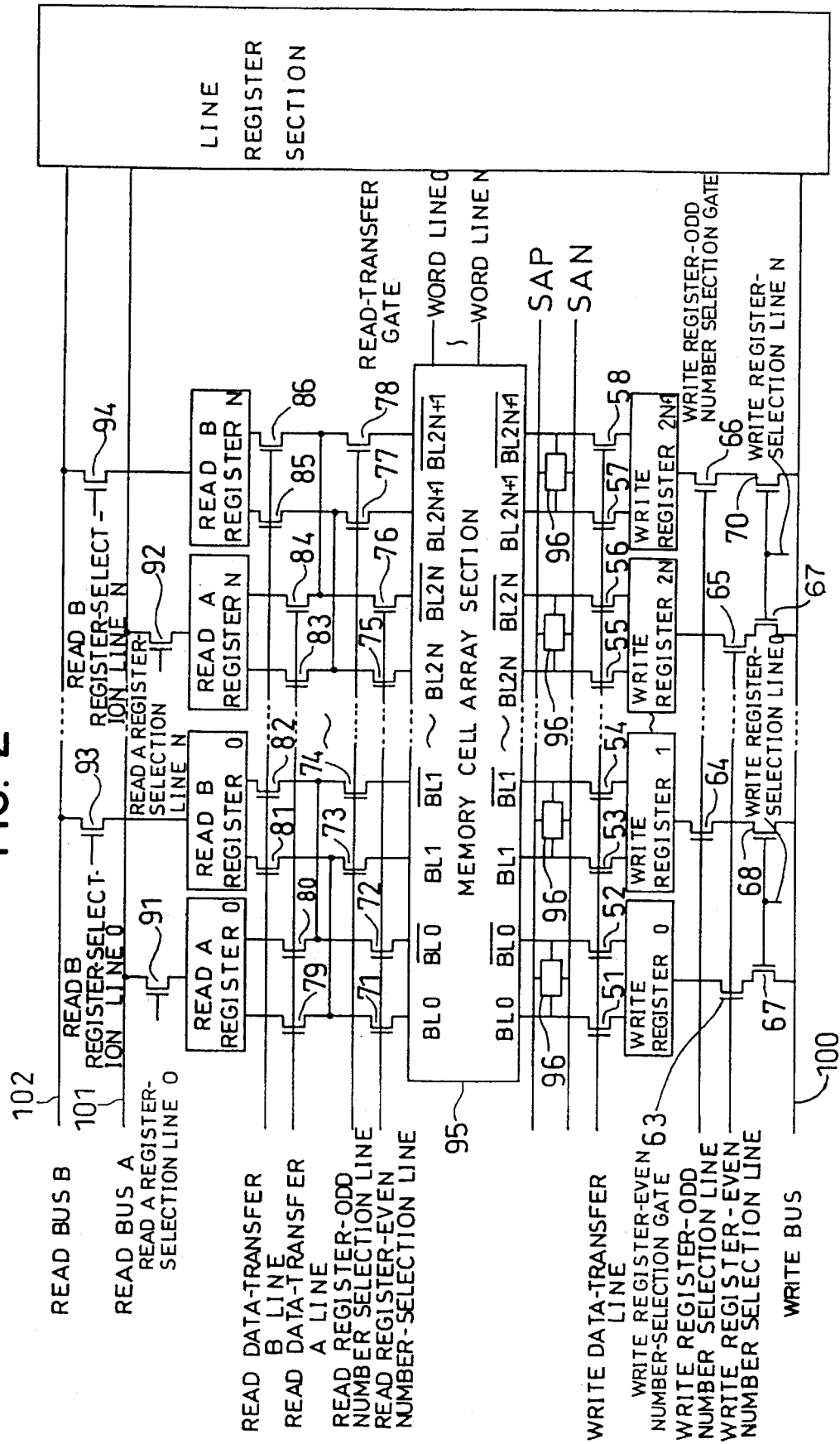
FIG. 2 is a diagram showing the structure of a semiconductor memory device according to a second embodiment of the present invention.

FIG. 2 is a diagram showing the structure of a semiconductor memory device according to a second embodiment of the present invention. The read-operation part of this semiconductor memory device is constructed in the same manner as in the first embodiment. The write-operation part of this semiconductor memory device, however, is constructed differently from that of the semiconductor memory device of the first embodiment; in the second embodiment, 2N+2 write registers are provided so that the number of the write registers is equal to that of the bit-line pairs.

Specifically, the bit-line pairs BL0,/BL0 and BL1,/BL1 are respectively connected to the write registers 0 and 1 through write-transfer gates 51 to 54, and are both connected to the read A register 0 and the read B register 0 through read-transfer gates 71 to 74 and 79 to 82.

Similarly, the bit-line pairs BL2N,/BL2N and BL2N+1,/BL2N+1 are respectively connected to the write registers 2N and 2N+1 through write-transfer gates 55 to 58, and are both connected to the read A register N and the read B register N through read-transfer gates 75 to 78 and 83 to 86.

The even-numbered write registers 0, ..., 2N are connected to a write bus 100 through write register-selection gates 67, ..., 69 and write register-even number-selection gates 63, ..., 65. The odd-numbered write registers 1, ..., 2N+1 are connected to the write bus 100 through write register-selection gates 68, ..., 70 and write register-odd number-selection gates 64, ..., 66. The read A registers 0 to N are connected to a read bus A (101) through read A register-selection gates 91, ..., 92. The read B registers 0 to N are connected to a read bus B (102) through read B register-selection gates 93, ..., 94. In FIG. 2, the reference numeral 96 denotes a sense amplifier.

The above-mentioned write register-even number-selection gates 63, ..., 65 constitute a first data-write means for transferring data from the write bus 100 to every first write register of groups of k (where k=2) write registers, i.e., the even-numbered write registers 0, ..., 2N. The write register-odd number-selection gates 64, ..., 66 constitute a second data-write means for transferring data from the write bus 100 to every (i+1)th write register of the write register groups, i.e., the odd-numbered write registers 1, ..., 2N+1.

Next, a write operation in the above-described semiconductor memory device of FIG. 2 will be described. Write data are sequentially input to the write bus 100 in synchronization with a clock, and first written into line registers in the same manner as in the above-described first embodiment, after which write register-selection lines 0 to N are sequentially selected in synchronization with the clock. A write register-even number-selection line is first selected, so that the write data in the write bus 100 are sequentially written into the even-numbered write registers 0, ..., 2N in synchronization with the clock. Then, a write register-odd number-selection line is selected, so that the write data in the write bus 100 are sequentially written into the odd-numbered write registers 1, ..., 2N+1 in synchronization with the clock. In this manner, the writing of data into all the write registers 0 to 2N+1 is completed.

Next, the data thus stored in the write registers 0 to 2N+1 are transferred to a memory cell array section 95. This data-transfer process is carried out as follows: First, one of word lines 0 to N in the memory cell array section 95 and a write data-transfer line are selected, so that the data in the write registers 0 to 2N+1 are transferred respectively to the corresponding bit-line pairs BL0,/BL0 to BL2N+1,/BL2N+1 of the memory cell array section 95. Then, sense amplifier-drive lines SAP and SAN are activated to activate the sense amplifiers 96, so that the data transferred to the bit-line pairs BL0,/BL0 to BL2N+1,/BL2N+1 are defined. Thereafter, the word line and the write data-transfer line which have been selected are deactivated, so that the data in the bit-line pairs BL0,/BL0 to BL2N+1,/BL2N+1 are written into the memory cells.

Since read operations to be performed through the read buses A and B in the second embodiment are carried out in the same manner as in the above-described first embodiment, the description thereof is herein omitted.

As described above, according to the second embodiment, the total number of the write registers 0 to 2N+1 is equal to that of the bit-line pairs of the memory cell array section 95 so that the write registers correspond to the bit-line pairs on a one-to-one basis. This makes it possible to carry out the following data-transfer process: After the data in all the write registers 0 to 2N+1 are transferred to the corresponding bit-line pairs, the data in the bit-line pairs are defined by means of the sense amplifiers 96. Therefore, unlike the above-described first embodiment, the data previously stored in all the bit-line pairs need not be defined by means of the sense amplifiers when the data in the write registers are written to every first or (i+1)th bit-line pair of the bit-line pair groups. Accordingly, in the second embodiment, the process of transferring data from the write registers to the bit-line pairs requires less power consumption.

In the above-described embodiments, the semiconductor memory devices of a two-output port type including the two read buses A and B are provided. But it is understood that the present invention can also be applied to a semiconductor memory device having three or more output ports. For example, in the case where a semiconductor memory device such as shown in FIG. 2 has three output ports, the data in the write bus 100 are written into every third write register, and the data are transferred from every third bit-line pair to the corresponding read registers.

THIRD EMBODIMENT

Figure 3:
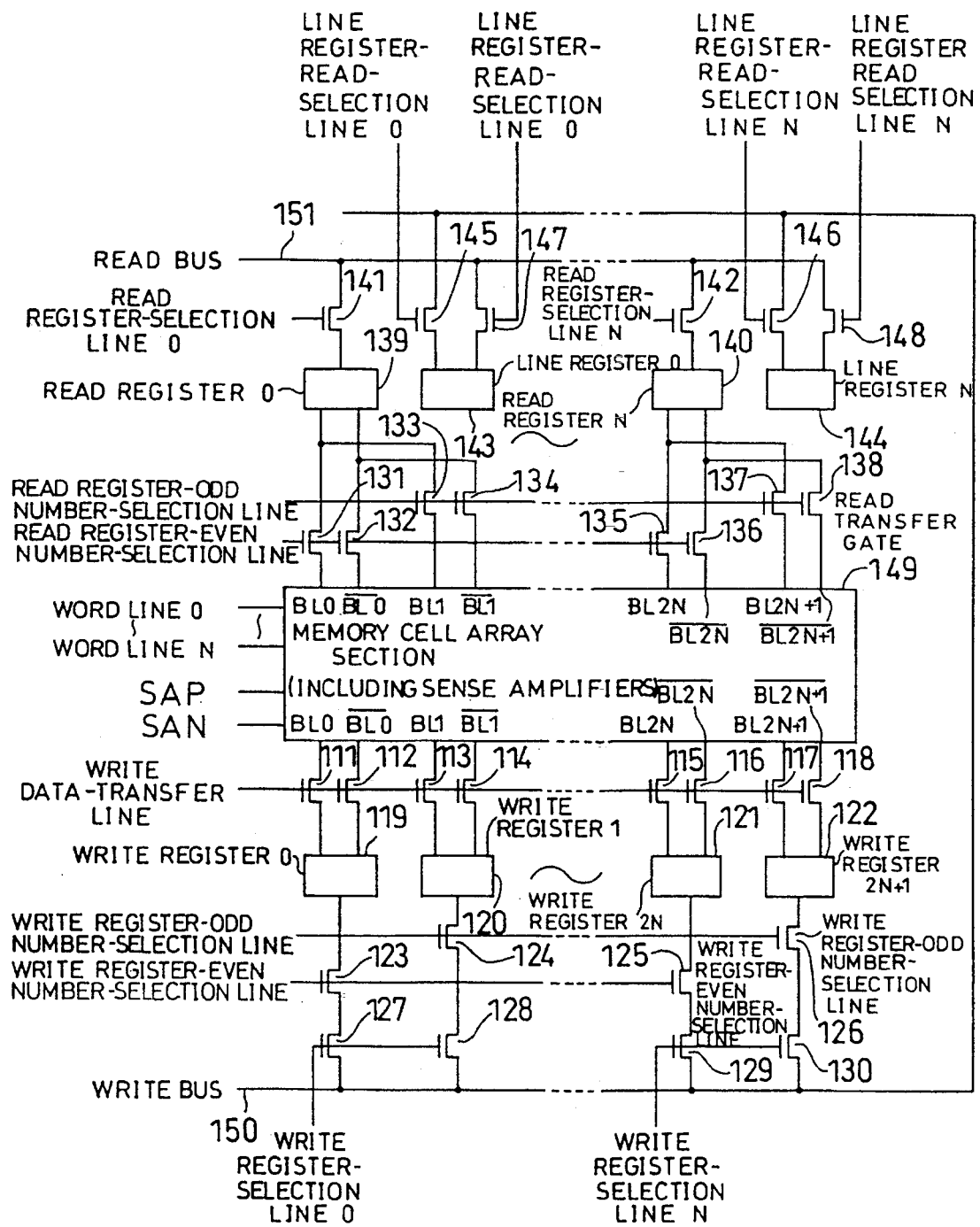
FIG. 3 is a diagram showing the structure of a semiconductor memory device according to a third embodiment of the present invention.
Figure 4:
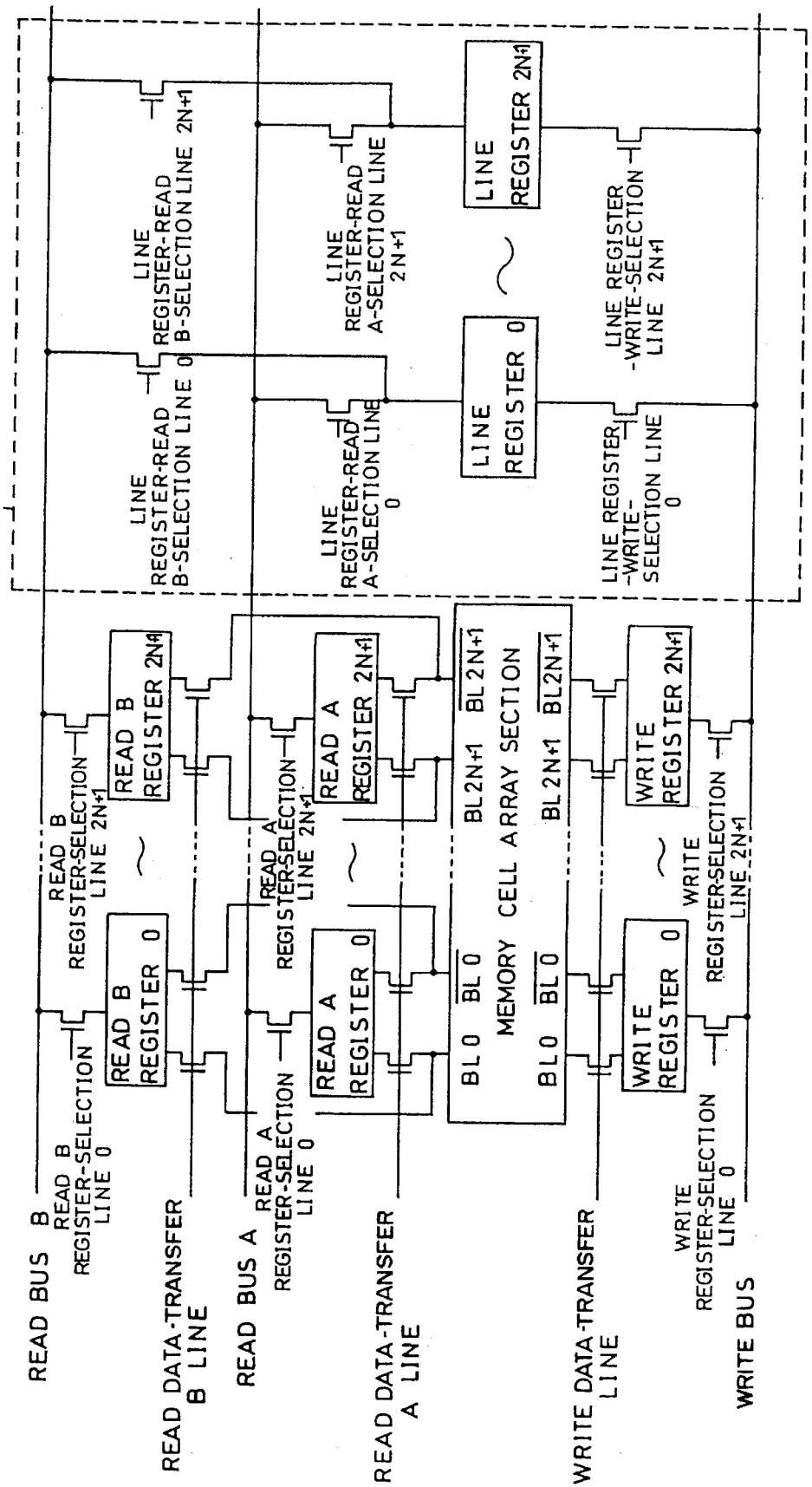
FIG. 4 is a diagram showing the structure of a conventional semiconductor memory device.
Figure 1:
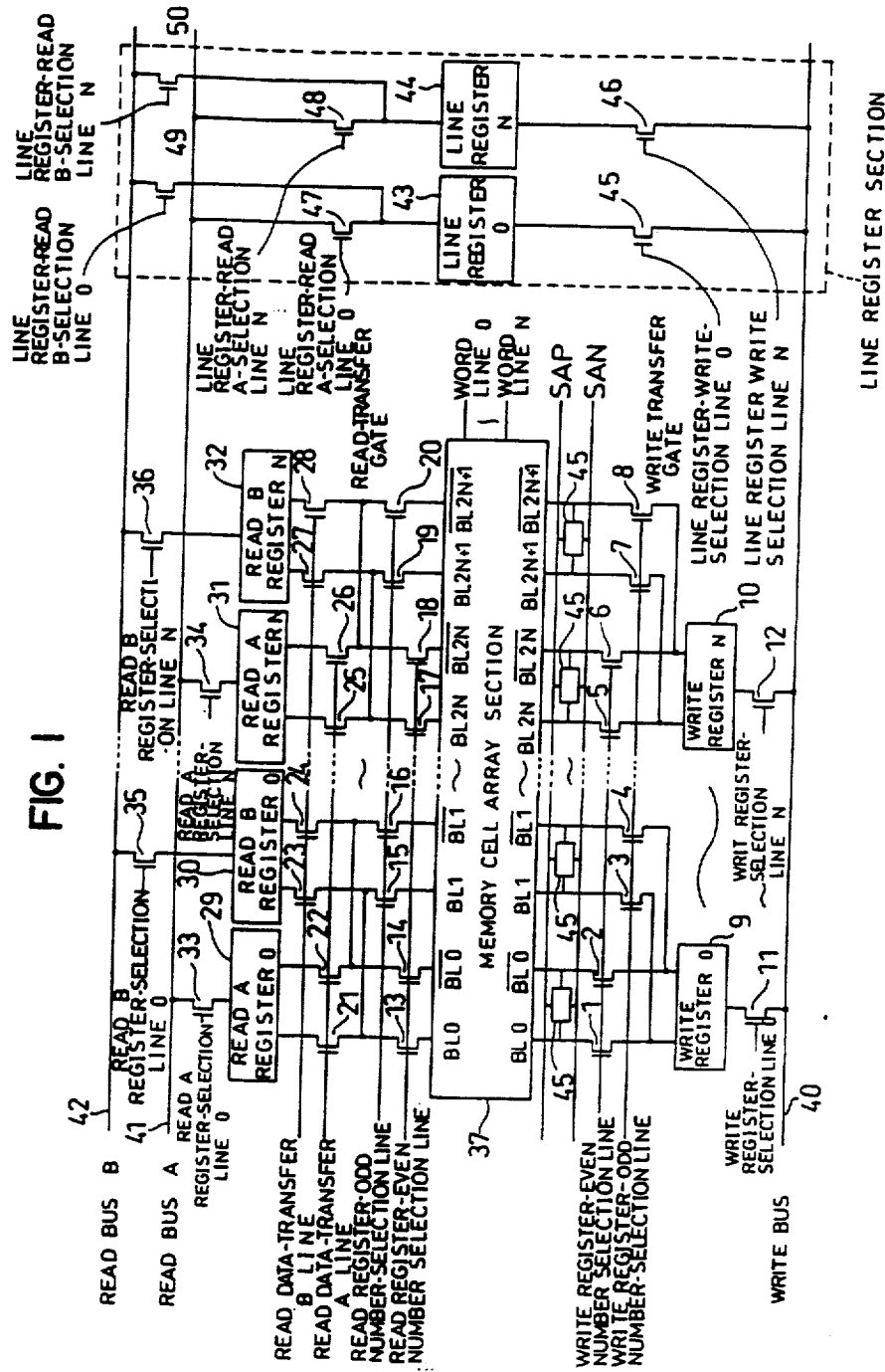

FIG. 3 is a diagram showing the structure of a semiconductor memory device according to a third embodiment of the present invention. The semiconductor memory device shown in FIG. 3 has one input port and one output port. Each data line in this semiconductor memory device is composed of a one-bit signal line. The write-operation part of this semiconductor memory device is constructed in the same manner as in the second embodiment. The read-operation part of this semiconductor memory device, however, is constructed differently from that of the semiconductor memory device of the second embodiment; in the third embodiment, the number of read registers is half the number of the bit-line pairs.

Specifically, the bit-line pairs BL0,/BL0 and BL1,/BL1 are respectively connected to write registers 0 and 1 through write-transfer gates 111 to 114, and are both connected to a read register 0 through read-transfer gates 131 to 134.

Similarly, the bit-line pairs BL2N,/BL2N and BL2N+1,/BL2N+1 are respectively connected to write registers 2N and 2N+1 through write-transfer gates 115 to 118, and are both connected to a read register N through read-transfer gates 135 to 138.

The even-numbered write registers 0, ..., 2N are connected to a write bus 150 through write register-selection gates 127, ..., 129 and write register-even number-selection gates 123, ..., 125. The odd-numbered write registers 1, ..., 2N+1 are connected to the write bus 150 through write register-selection gates 128, ..., 130 and write register-odd number-selection gates 124, ..., 126. The read registers 0 to N (139, ..., 140) are connected to a read bus 151 through read register-selection gates 141, ..., 142.

Line registers 0 to N (143, ..., 144) for holding data obtained immediately after reset are connected to the write bus 150 respectively through line register-write-selection gates 145, ..., 146, and also connected to the read bus 151 respectively through line register-read-selection gates 147, ..., 148. All of the selection and transfer gates 111 to 118, 123 to 138, 141, ..., 142, and 145 to 148 are controlled by means of selection and transfer lines which respectively correspond thereto.

Since the write operation of the present embodiment in which data are written through the write bus is the same as that of the second embodiment, the description thereof is herein omitted.

A data-read operation to be performed through the read bus 151 will now be described. First, a read register-even number-selection line is selected, so that the data which have been first written into a memory cell array section 149, i.e., the data stored in the even-numbered bit-line pairs BL0,/BL0, ..., BL2N,/BL2N, are transferred respectively to the corresponding read registers 0 to N (139, ..., 140). At this time, line register-read-selection lines 0 to N are sequentially selected in synchronization with a clock, thereby allowing the data in the line registers 0 to N (143, ..., 144) to be sequentially read out into the read bus 151.

Next, read register-selection lines 0 to N are sequentially selected in synchronization with the clock, so that the data which have been read out into the read registers 0 to N (139, ..., 140) are sequentially read out into the read bus 151.

Then, a read register-odd number-selection line is selected, so that the data which have been subsequently written into the memory cell array section 149, i.e., the data stored in the odd-numbered bit-line pairs BL1,/BL1, ..., BL2N+1,/BL2N+1, are transferred respectively to the corresponding read registers 0 to N (139, ..., 140).

Thereafter, in the same manner as described above, the read register-selection lines 0 to N are sequentially selected in synchronization with the clock, so that the data which have been read out into the read registers 0 to N (139, ...

, 140) are sequentially read out into the read bus 151. In this manner, the reading of data from all the bit-line pairs is completed.

In the present embodiment, each of the N+1 read registers 139, ..., 140 is shared by two bit-line pairs in the memory cell array section 149, and accordingly, the sum of the numbers of the read registers 139, ..., 140 and the line registers 143, ..., 144 is 2N+2, which is equal to the number of the bit-line pairs of the memory cell array section 149. Therefore, these read and line registers, the total number of which is 2N+2, can be aligned along the same lane, so that the entire memory chip can be made smaller in size.

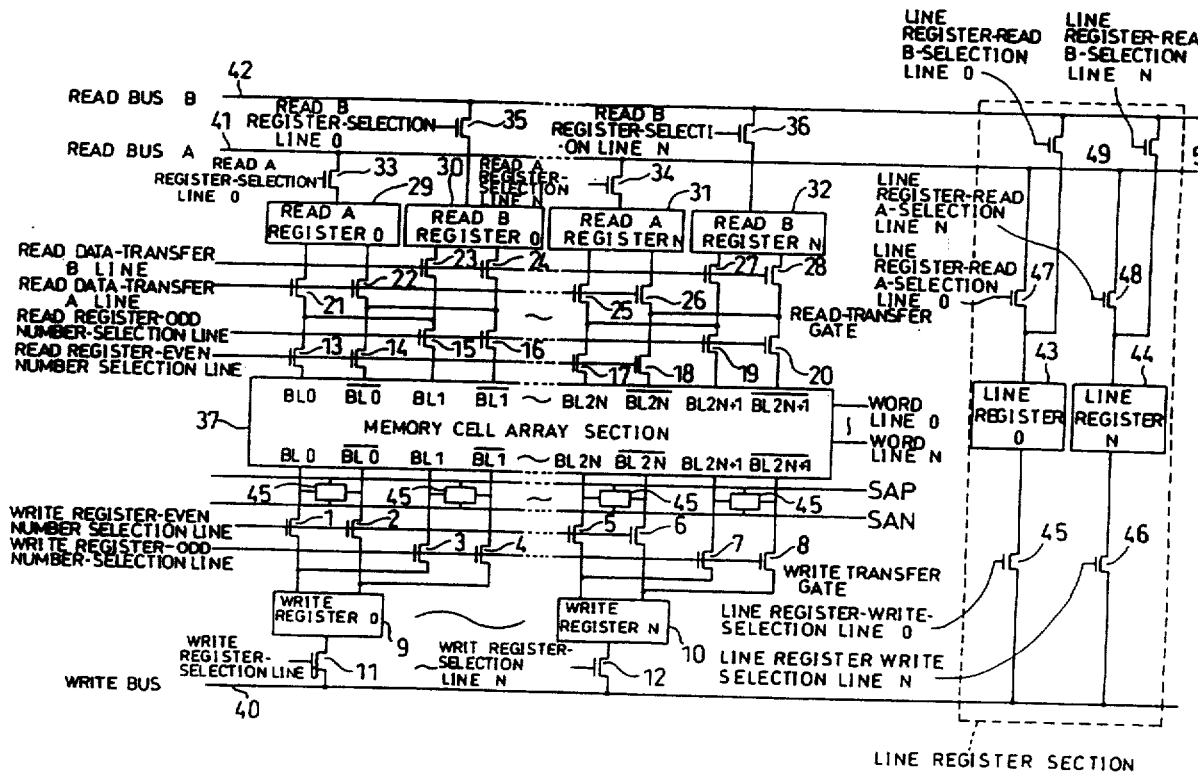

We claim:

1. A semiconductor memory device comprising a single write bus, k read buses, where k is an integer greater than one (1), a memory cell array section including a plurality of bit-line pairs partitioned into groups of k bit-line pairs, a plurality of write registers for receiving data from said write bus, and sets of read registers, said sets respectively corresponding to said read buses, wherein said semiconductor memory device comprises:

a first write data-transfer means for transferring data from said write registers to every first bit-line pair of said bit-line pair groups of said memory cell array section;

second, ..., kth write data-transfer means for transferring data from said write registers to every (i+1)th bit-line pair of said bit-line pair groups (where i=1, 2, ..., k–1) of said memory cell array section;

a first read data-transfer means which is capable of transferring the data from said every first bit-line pair of the bit-line pair groups of said memory cell array section to said sets of read registers; and second, ..., kth read data-transfer means which are capable of transferring the data from said every (i+1)th bit-line pair of the bit-line pair groups of said memory cell array section to said sets of read registers.

2. A control method for the semiconductor memory device of claim 1, wherein data are sequentially input from the single write bus to the write registers, and then the thus input data are transferred to said every first bit-line pair of the bit-line pair groups of the memory cell array section by the first write data-transfer means, and thereafter, data are again sequentially input from said write bus to the write registers, and the thus input data are transferred to said every (i+1)th bit-line pair of said bit-line pair groups of said memory cell array section sequentially by the (i+1)th write data-transfer means, said inputting and transfer of data being repeated, thereby completing the writing of the data into all the bit-line pairs of said memory cell array section; and thereafter, the data in said every first bit-line pair of said bit-line pair groups of said memory cell array section are transferred by the first read data-transfer means into a single set of read registers corresponding to one of the read buses which is used for reading of data, and accordingly, the thus transferred data are sequentially read out of said read bus, and then the data in said every (i+1)th bit-line pair of the bit-line pair groups of said memory cell array section are transferred into said single set of read registers sequentially by the (i+1)th read data-transfer means, and accordingly, the thus transferred data are sequentially read out of said read bus, said transfer and reading of data being repeated, thereby completing the reading of the data from all the bit-line pairs of said memory cell array section.

3. A semiconductor memory device comprising a single write bus, k read buses, where k is an integer greater than one (1), a memory cell array section including a plurality of bit-line pairs partitioned into groups of k bit-line pairs, a plurality of write registers for receiving data from said write bus, said write registers partitioned into groups of k write registers, and sets of read registers, said sets respectively corresponding to said read buses, wherein said write registers are respectively connected to the bit-line pairs of said memory cell array section, and said semiconductor memory device comprises:

a first data-write means for transferring data from said write bus to every first write register of said write register groups;

second, ..., kth data-write means for transferring data from said write bus to every (i+1)th write register of said write register groups (where i=1, 2, ..., k–1);

a first read data-transfer means which is capable of transferring data from every first bit-line pair of said bit-line pair groups of said memory cell array section to said sets of read registers; and second, ..., kth read data-transfer means which are capable of transferring data from every (i+1)th bit-line pair of said bit-line pair groups of said memory cell array section to said sets of read registers.

4. A control method for the semiconductor memory device of claim 3, wherein data are sequentially input from the single write bus to said every first write register of said write register groups by the first data-write means, and then data sequentially input to said write bus are input to said every (i+1)th write register of said write register groups repeatedly by the (i+1)th data-write means, and thereafter, the data thus input to the write registers are respectively written to the bit-line pairs of the memory cell array section; and thereafter, the data in said every first bit-line pair of said bit-line pair groups of said memory cell array section are transferred by the first read data-transfer means into a single set of read registers corresponding to one of the read buses which is used for reading of data, and accordingly, the thus transferred data are sequentially read out of said read bus, and then the data in said every (i+1)th bit-line pair of said bit-line pair groups of said memory cell array section are transferred into said single set of read registers sequentially by the (i+1)th read data-transfer means, and accordingly, the thus transferred data are sequentially read out of said read bus, said transfer and reading of data being repeated, thereby completing the reading of the data from all the bit-line pairs of said memory cell array section.

5. The semiconductor memory device of claims 1 or 3, or the control method of claims 2 or 4, wherein the integer k is 2.

6. A semiconductor memory device comprising: a single write bus; k read buses, where k is an integer greater than zero (0); a memory cell array section including a plurality of bit-line pairs partitioned into groups of k bit-line pairs; a plurality of write registers for receiving data from said write bus, said write registers partitioned into groups of k write registers; sets of read registers, said sets respectively corresponding to said k read buses; and line registers for receiving data from said write bus and outputting the data to said k read buses, wherein said write registers are respectively connected to the bit-line pairs of said memory cell array section, and said semiconductor memory device comprises;

a first data-write means for transferring data from said write bus to every first write register of said write register groups;

second, . . . , kth data-write means for transferring data from said write bus to every (i+1)th write register of said write register groups (where i=2, . . . , k);

a first read data-transfer means which is capable of transferring data from every first bit-line pair of said bit-line pair groups of said memory cell array section to said sets of read registers; and second, . . . , kth read data-transfer means which are capable of transferring data from every (i+1)th bit-line pair of said bit-line pair groups of said memory cell array section to said sets of read registers.

7. A control method for the semiconductor memory device of claim 6, wherein data are first sequentially input from the single write bus to the line registers, and then data sequentially input to said write bus are input to said every first write register of said write register groups by the first data-write means, and then data sequentially input to said write bus are input to said every (i+1)th write register of said write register groups repeatedly by the (i+1)th data-write means, and thereafter, the data thus input to the write registers are respectively written to the bit-line pairs of the memory cell array section; and thereafter, while the data in said line registers are being sequentially read out into one of the read buses which is used for reading of data, the data in said every first bit-line pair of said bit-line pair groups of said memory cell array section are transferred by the first read data-transfer means into a single set of read registers corresponding to said read bus, and accordingly, the thus transferred data are sequentially read out of said read bus, and then the data in said every (i+1)th bit-line pair of said bit-line pair groups of said memory cell array section are transferred into said single set of read registers sequentially by the (i+1)th read data-transfer means, and accordingly, the thus transferred data are sequentially read out of said read bus, said transfer and reading of data being repeated, thereby completing the reading of the data from all the bit-line pairs of said memory cell array section.

8. The semiconductor memory device of claim 6, or the control method of claim 7, wherein the integer k is one (1).

* * * * *

UNITED STATES PATENT AND TRADEMARK OFFICE
CERTIFICATE OF CORRECTION

PATENT NO. : 5,530,670
DATED : June 25, 1996
INVENTOR(S) : Akihiro Matsumoto

It is certified that error appears in the above-identified patent and that said Letters Patent is hereby corrected as shown below:

The title page should be deleted and substitute therefor the attached title page.

Delete Drawing Sheet 1, and substitute therefor the Drawing Sheet, consisting of FIG. 1, as shown on the attached page.

Signed and Sealed this

Eleventh Day of March, 1997

*Attest:*

BRUCE LEHMAN

*Attesting Officer*     *Commissioner of Patents and Trademarks*

United States Patent [19]

Matsumoto

[11] Patent Number: 5,530,67

[45] Date of Patent: Jun. 25, 199

[54] SEMICONDUCTOR MEMORY DEVICE AND CONTROL METHOD FOR THE SAME

[75] Inventor: Akihiro Matsumoto, Osaka, Japan

[73] Assignee: Matsushita Electronics Corporation, Osaka, Japan

[21] Appl. No.: 318,331

[22] Filed: Oct. 5, 1994

[30] Foreign Application Priority Data

Nov. 10, 1993 [JP] Japan ................. 5-279993

[51] Int. Cl.$^6$ ................................. G11C 7/00
[52] U.S. Cl. .................. 365/189.01; 365/189.12; 365/230.04; 365/230.05
[58] Field of Search ............. 365/189.01, 230.04, 365/230.05, 230.09, 189.12, 239

[56] References Cited

U.S. PATENT DOCUMENTS

| | | | |
|---|---|---|---|
| 5,040,149 | 8/1991 | Ibihara et al. | 365/230.04 X |
| 5,319,603 | 6/1994 | Watanabe et al. | 365/230.04 X |
| 5,418,745 | 5/1995 | Watanabe | 365/230.05 X |

*Primary Examiner*—David C. Nelms
*Assistant Examiner*—Huan Hoang
*Attorney, Agent, or Firm*—William Brinks Hofer Gilson & Lione

[57] ABSTRACT

In a semiconductor memory device of a multiple-output por type including a plurality of read buses, data in a write bu are sequentially written into write registers, and the thu written data are transferred to the even-numbered bit-lin pairs of a memory cell array section, and then data are agai written into the write registers, after which the thus writte data are transferred to the odd-numbered bit-line pairs Then, the data in the even-numbered bit-line pairs ar transferred to read A registers which correspond to one of th read buses, and the thus transferred data are sequentiall read into the read bus, and thereafter, the data in th odd-numbered bit-line pairs are transferred to the read A registers and the thus transferred data are sequentially reac into the read bus. Thus, the total number of read register corresponding to all the read buses is made equal to that of the bit-line pairs, and is accordingly smaller as compared with a conventional semiconductor memory device. This allows all the read registers to be aligned along the same lane, so that the entire memory chip can be made smaller in size.

8 Claims, 4 Drawing Sheets